(12) United States Patent  (10) Patent No.: US 8,040,735 B2
Honma  (45) Date of Patent: Oct. 18, 2011

(54) SEMICONDUCTOR MEMORY DEVICE CAPABLE OF DETECTING WRITE COMPLETION AT HIGH SPEED

(75) Inventor: Mitsuaki Honma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 287 days.

(21) Appl. No.: 12/406,385

(22) Filed: Mar. 18, 2009

(65) Prior Publication Data

US 2010/0008157 A1    Jan. 14, 2010

(30) Foreign Application Priority Data

Jul. 10, 2008  (JP) .................................. 2008-180630

(51) Int. Cl.
 *G11C 11/34* (2006.01)
(52) U.S. Cl. ......... 365/185.22; 365/189.05; 365/189.16; 365/207; 365/236
(58) Field of Classification Search ............. 365/185.09, 365/189.05, 189.07, 189.08, 201, 207, 236, 365/233.16

See application file for complete search history.

(56) References Cited

U.S. PATENT DOCUMENTS 5,566,113 A * 10/1996 Saito et al. ..................... 365/201
2006/0291291 A1 * 12/2006 Hosono et al. ............ 365/185.22

FOREIGN PATENT DOCUMENTS

JP    2006-277786    10/2006
JP    2007-102942    4/2007

* cited by examiner

*Primary Examiner* — Pho M Luu
*Assistant Examiner* — Thao Bui
(74) *Attorney, Agent, or Firm* — Oblon, Spivak, McClelland, Maier & Neustadt, L.L.P.

(57) ABSTRACT

A memory cell array has a plurality of memory cells arrayed in row and column directions. A plurality of sense amplifier units includes a plurality of sense amplifiers detecting write completion of each of the memory cells selected for each row. A plurality of detection units is arranged correspondingly to the sense amplifier units, and forms a transfer path for transferring potential in accordance with a detection output signal of each sense amplifier unit. The detection units detect a sense amplifier unit corresponding to a portion where the transfer path breaks off, as a sense amplifier unit including write incompletion bit.

16 Claims, 12 Drawing Sheets

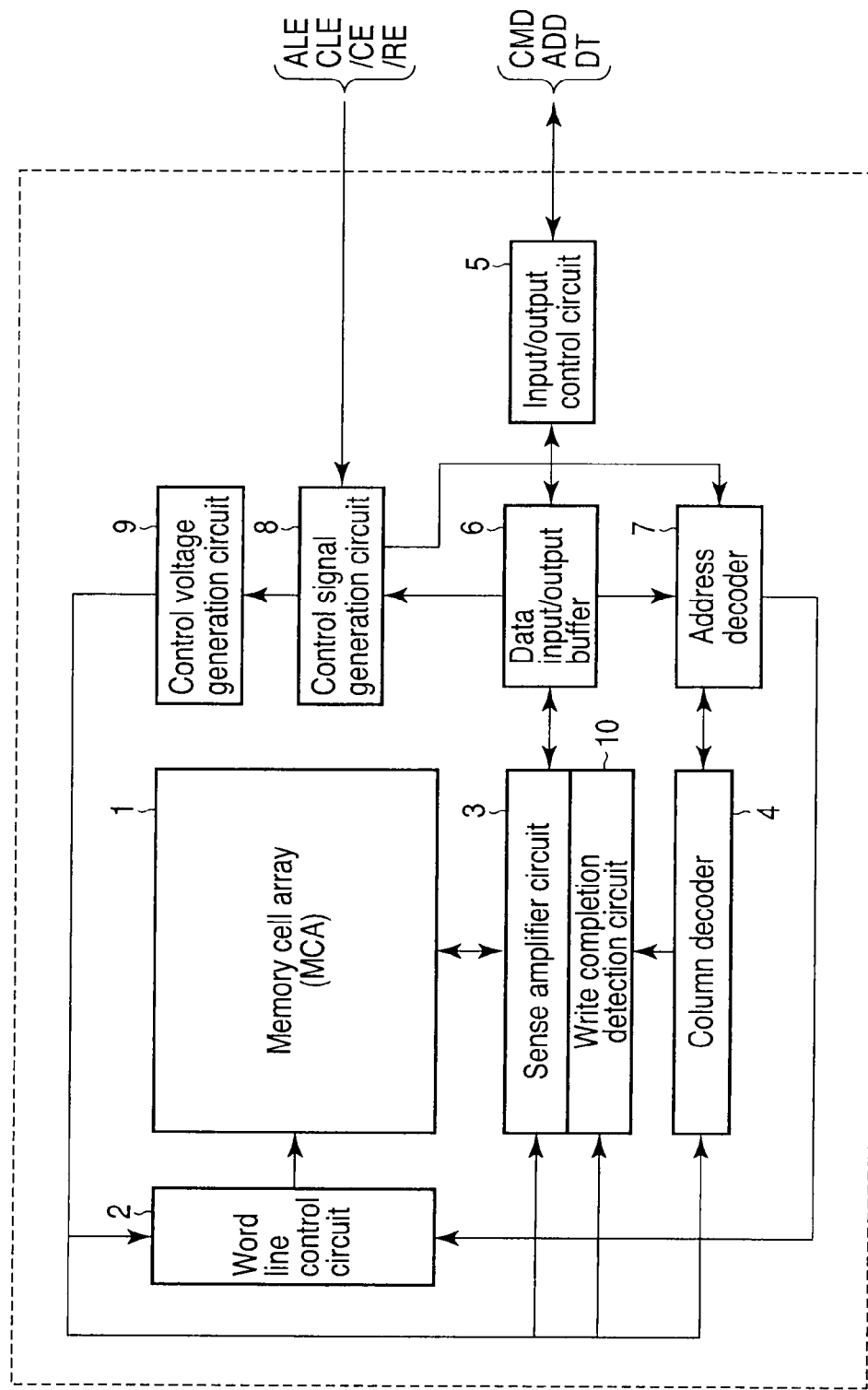
F I G. 1

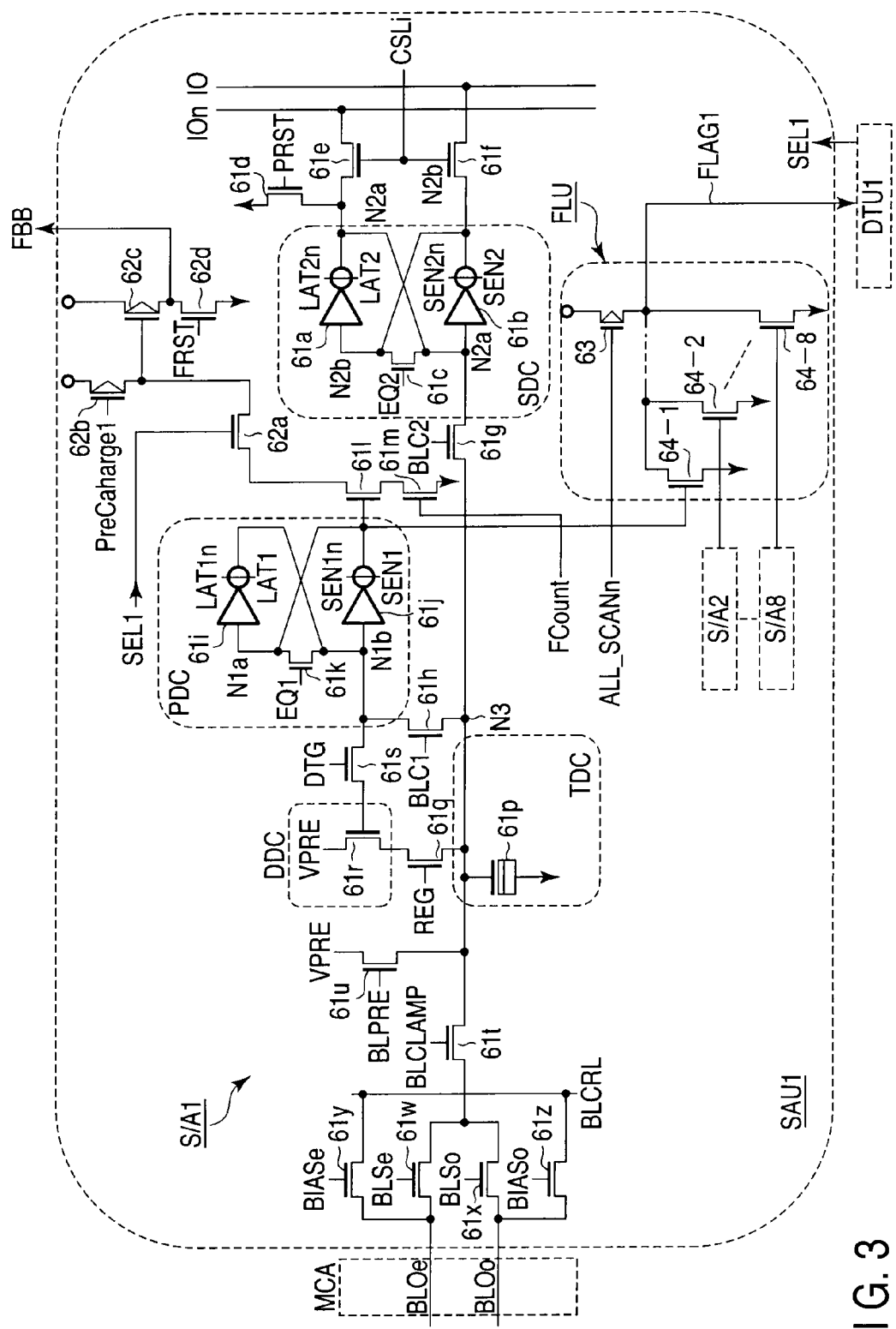
F I G. 3

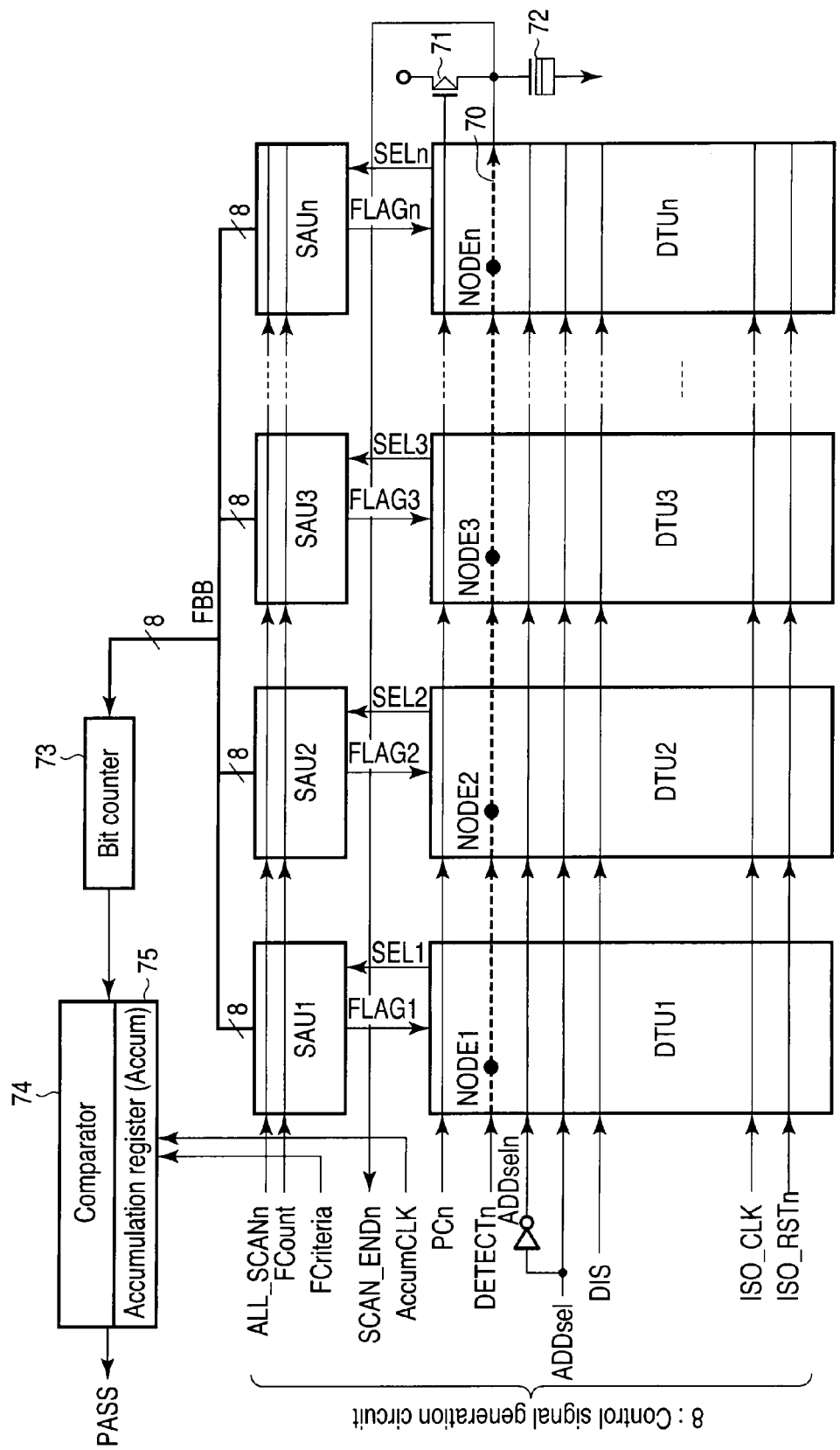
F I G. 4

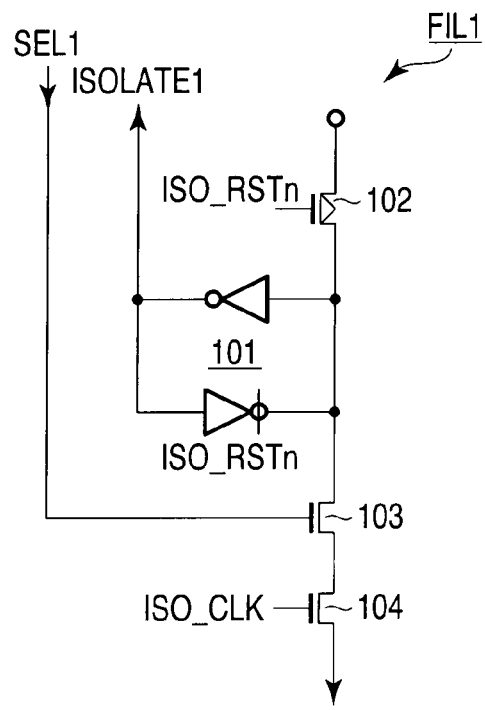
F I G. 6
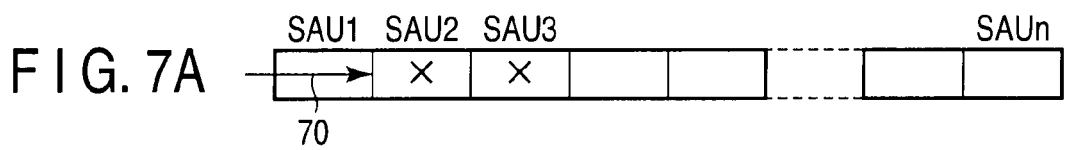
F I G. 7A
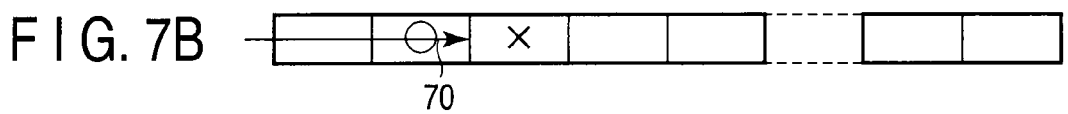
F I G. 7B
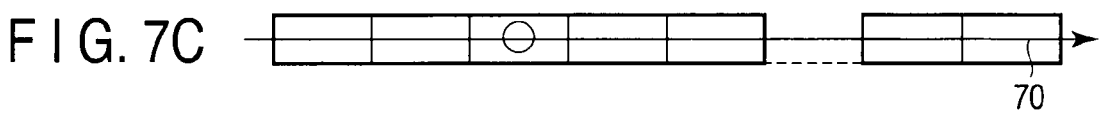
F I G. 7C

F I G. 10A 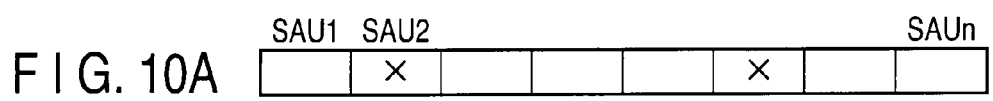
F I G. 10B 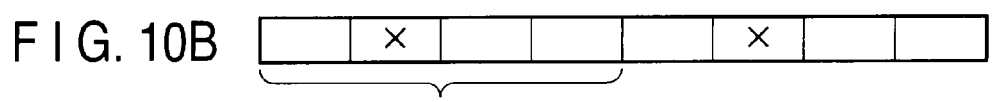
F I G. 10C 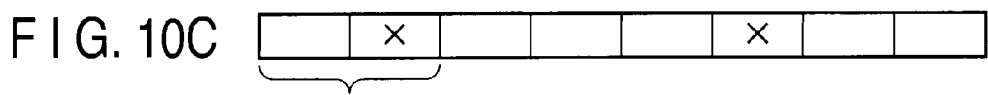
F I G. 10D 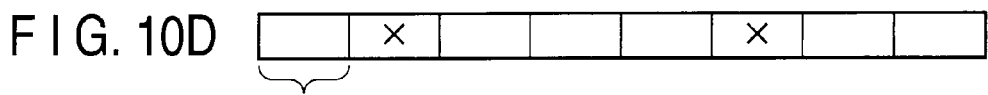
F I G. 10E 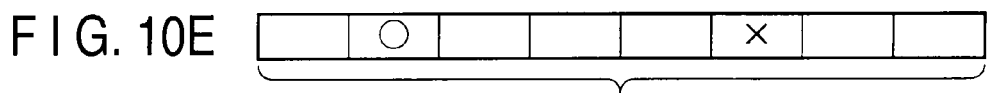
F I G. 10F 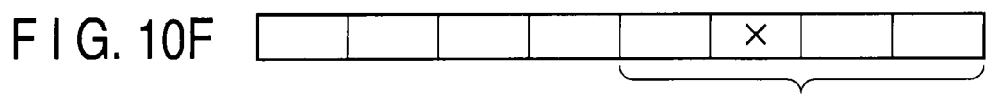
F I G. 10G 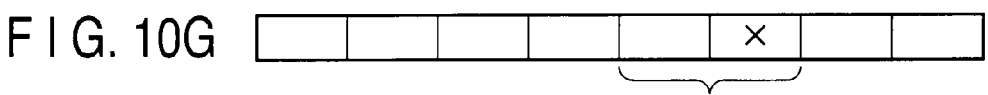
F I G. 10H 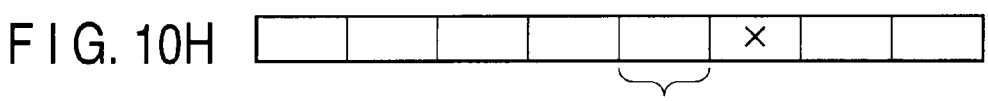

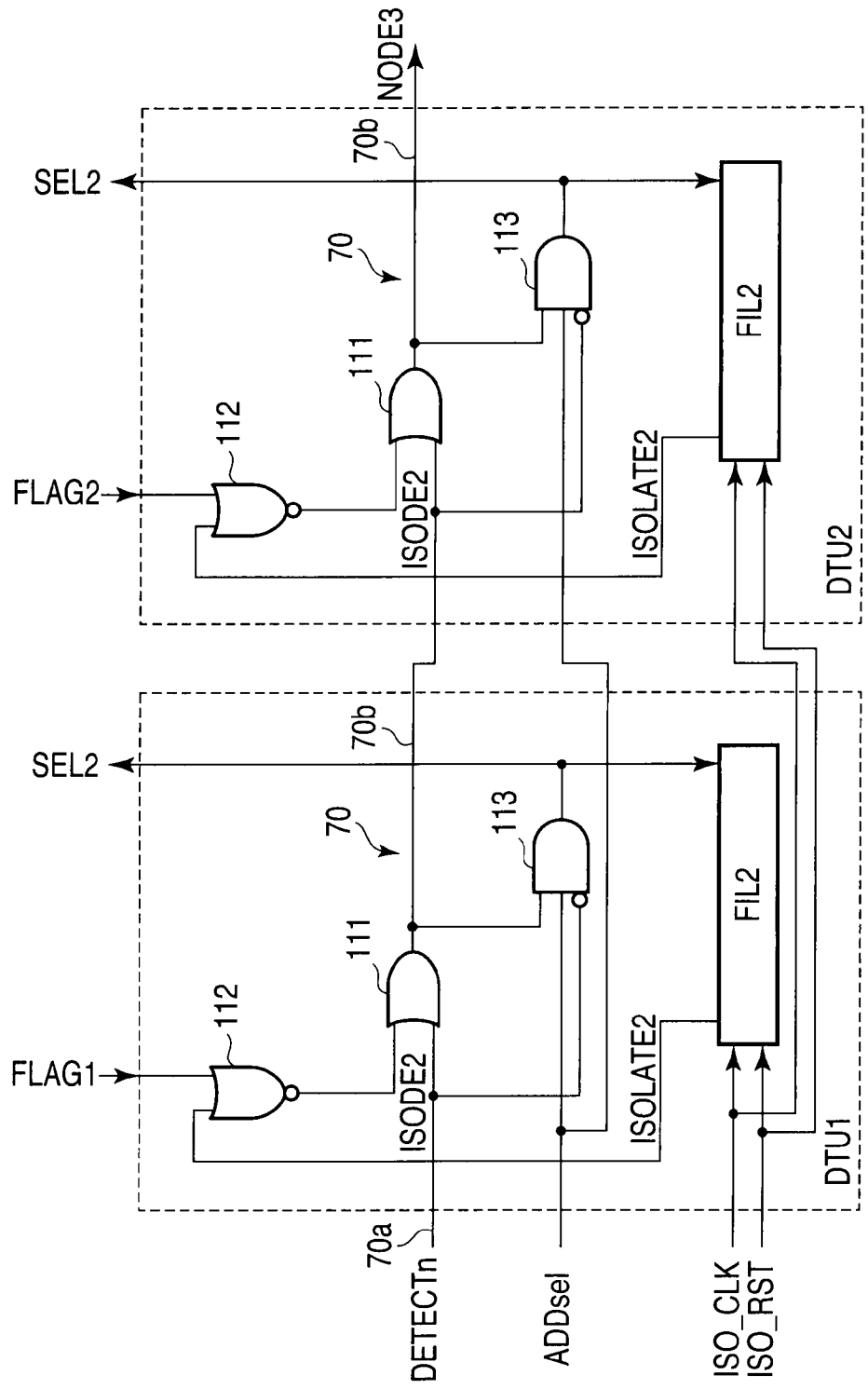
F I G. 11

US 8,040,735 B2

SEMICONDUCTOR MEMORY DEVICE CAPABLE OF DETECTING WRITE COMPLETION AT HIGH SPEED

CROSS-REFERENCE TO RELATED APPLICATIONS

This application is based upon and claims the benefit of priority from prior Japanese Patent Application No. 2008-180630, filed Jul. 10, 2008, the entire contents of which are incorporated herein by reference.

BACKGROUND OF THE INVENTION

1. Field of the Invention

The present invention relates to a rewritable nonvolatile semiconductor memory device. In particular, the present invention relates to a semiconductor memory device, which detects the number of cells having no write completion.

2. Description of the Related Art

A NAND flash memory has been developed as a nonvolatile semiconductor memory device. In the NAND flash memory, data is written in page units. Specifically, data is collectively written to a plurality of memory cells connected to a selected word line. The data write operation of the NAND flash memory is largely classified into two. One is an operation of applying a write voltage to the memory cells of a page unit, and programming the memory cells. The other is a write completion verification operation of verifying whether the write operation of the memory cells is all completed. After the write completion verification operation, it is judged whether the write operation ends. If the judgment result is pass, the write operation ends.

There has been known the following operations as a method of detecting whether write of the memory cells is completed (e.g., see Jpn. Pat. Appln. KOKAI Publications No. 2006-277786 and 2007-102942). One is a batch detection operation, and the other is a bad bit detection operation of detecting the number of bad bits. The batch detection operation presumes that all sense amplifier circuits detect a write operation completion. For this reason, long time is taken to detect the write completion. The bad bit detection operation is a detection method of permitting several bits having write incompletion (hereinafter, referred to as fail bit). Recently, an error correction code (ECC) technique is employed, and thereby, a bit error is saved; therefore, several fail bits are permitted. According to the bad bit detection operation, there is no need to wait write completion of all bits. Therefore, detection time is shortened compared with the batch detection operation. Thus, the bad bit detection operation is effective as the write completion detection method.

However, the bad bit detection operation has a need to accurately count the number of fail bits. For this reason, the bad bit detection operation has a problem of requiring time to count the fail bits. Therefore, it is desired to provide a semiconductor memory device, which can detect fail bits at high speed.

BRIEF SUMMARY OF THE INVENTION

According to a first aspect of the invention, there is provided a semiconductor memory device comprising: a memory cell array having a plurality of memory cells arranged in row and column; a plurality of sense amplifier units configured to detect write completion of the selected memory cells; and a plurality of detection units arranged correspondingly to the sense amplifier units, each of the detection units forming a transfer path for transferring potential in accordance with detection signals output from the sense amplifier units, and detecting a sense amplifier unit corresponding to a portion where the transfer path breaks off as a sense amplifier unit including a write incompletion bit.

According to a second aspect of the invention, there is provided a semiconductor memory device comprising: a memory cell array having a plurality of memory cells arrayed in row and column directions; a plurality of sense amplifier units including a plurality of sense amplifiers, each of the sense amplifier units outputting a detection signal showing write completion of each of the memory cells selected in accordance with an output signal of the sense amplifiers; and a plurality of detection units arranged correspondingly to the sense amplifier units, each of the detection units including: a transfer gate having first and second gates, the first gate being supplied with the detection signal output from the sense amplifier unit; a first transfer path connected to one terminal of a current path of the transfer gate; a second transfer path connected to the other terminal of a current path of the transfer gate; and a detection circuit connected to the first ad second transfer paths, the detection circuit detecting the corresponding sense amplifier unit as a sense amplifier unit including a write incompletion bit when potential is different between the first and second transfer paths.

According to a third aspect of the invention, there is provided A method of inspecting a semiconductor memory device, comprising: detecting a sense amplifier unit corresponding to a portion where a path connecting a plurality of detection units arranged correspondingly to a plurality of sense amplifier units and detecting an output signal of each sense amplifier unit, breaks off, as a sense amplifier unit including write incompletion bit; counting the number of write incompletion bits included in the detected sense amplifier unit; accumulating the number of the counted bits; comparing the number of accumulated bits with a reference value; and repeating the detection, the count, the accumulation and the comparison when the number of accumulated bits is less than a reference value.

BRIEF DESCRIPTION OF THE SEVERAL VIEWS OF THE DRAWING

FIG. 1 is a block diagram schematically showing the configuration of a semiconductor memory device according to one embodiment;

FIG. 3 is a circuit diagram showing a sense amplifier unit;

FIG. 4 is a block diagram schematically showing the configuration to explain the relationship between a sense amplifier unit and a detection circuit unit;

FIG. 6 is a circuit diagram showing a fail information latch circuit;

FIGS. 7A to 7C are views schematically showing a fail bit detection operation according to one embodiment;

FIGS. 10A to 10H are views showing a comparison example of the fail bit detection operation;

FIG. 11 is a circuit diagram showing the configuration of a detection circuit unit according to a modification example.

DETAILED DESCRIPTION OF THE INVENTION

Figure 2:
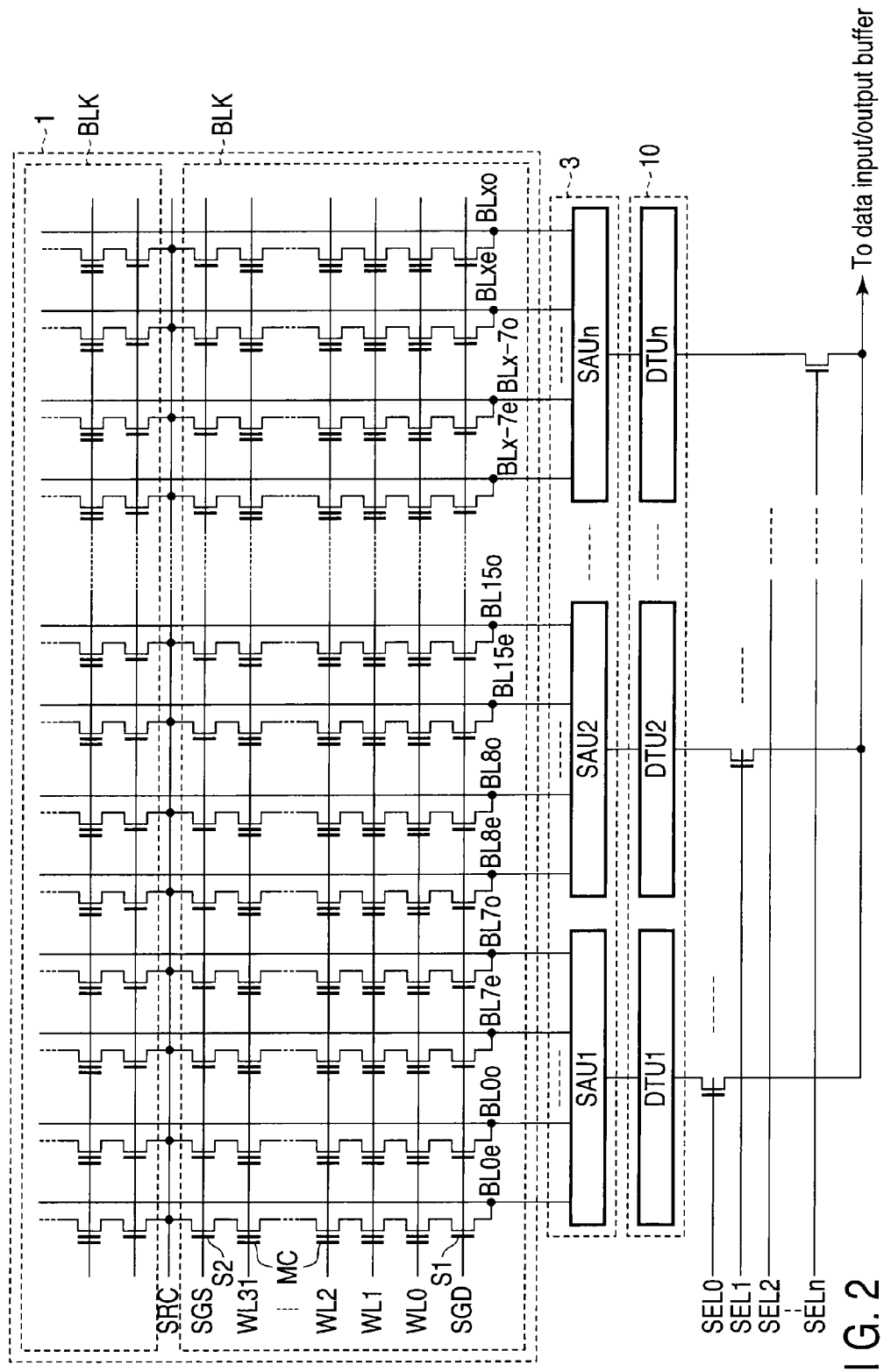
FIG. 2 is a block diagram showing ach configuration of a memory cell array, a sense amplifier circuit and a write completion detection circuit, which are shown in FIG. 1.

One embodiment of the present invention will be hereinafter described with reference to the accompanying drawings.

FIG. 1 schematically shows the configuration of a semiconductor memory device according to one embodiment of the present invention. In FIG. 1, a memory cell array (MCA) comprises a NAND flash memory, which is capable of storing 2-bit data in one memory cell. Specifically, the memory cell array 1 includes a plurality of bit lines and word lines, a common source line and a plurality of memory cells each comprising an EEPROM cell, which is electrically rewritable and arrayed in row and column directions, as described later. A word line control circuit 2 given as a row decoder is connected to the word line of the memory cell array 1 to select and drive a word line. A sense amplifier circuit 3 is connected to the bit line of the memory cell array 1, and as described later, has a data read/write function and a data latch function of holding read data and write data. A column decoder 4 outputs a column select signal for selecting a bit line of the memory cell array 1 in accordance with an output signal from an address decoder 7.

An input/output control circuit 5 receives various commands CMD supplied externally, an address signal ADD ad a write data DT. In a data write operation, write data is supplied from the input/output control circuit 5 to the sense amplifier circuit 3 via a data input/output buffer 6. In a data read operation, data read to the sense amplifier circuit 3 is supplied to the input/output control circuit 5 via the data input/output buffer 6, and then, output from the circuit 5 externally.

An address signal supplied from the input/output control circuit 5 to the data input/output buffer 6 is supplied to the address decoder 7. A signal decoded by the address decoder 7 is supplied to the word line control circuit 2 and the column decoder 4.

A command supplied from the input/output control circuit 5 to the data input/output buffer 6 is supplied to a control signal generation circuit 8. The control signal generation circuit 8 is supplied with external control signals such as a chip enable signal/CE, a write enable signal/WE, a read enable signal/RE, an address latch enable signal ALE and a command latch enable signal CLE. The circuit 8 further generates the following control signals based on external control signal supplied in accordance with an operation mode and command. One is a control signal for controlling data write and erase sequence, and the other is a control signal for controlling data read. The foregoing control signals are supplied to a control voltage generation circuit 9 and the address decoder 7.

The control voltage generation circuit 9 generates a voltage required for various operations of the memory cell array, the sense amplifier circuit 3 and the column decoder 4 in accordance with various control signals supplied from the control signal generation circuit 8. For example, a read voltage, a write voltage, a verify voltage and an erase voltage are given as the foregoing voltage.

A write completion detection circuit 10 is connected between the sense amplifier circuit 3 and the column decoder 4. The write completion detection circuit 10 is used for detecting a fail bit. A write completion detection operation is carried out based on a signal output from the sense amplifier circuit 3 after write and verify operations.

FIG. 2 shows each configuration of the memory cell array 1, the sense amplifier circuit 3 and the write completion detection circuit 10, which are shown in FIG. 1. The memory cell array 1 includes a plurality of blocks BLK shown by a broken line. These blocks form an erase unit. Each block BLK is provided with a plurality of NAND cells. One NAND cell is composed of a memory cell MC comprising 32 series-connected EEPROMs, select gate transistors S1 and S2. The select gate transistor S1 is connected to even bit lines BL0$e$ to BL$xe$ and odd bit lines BL0$o$ to BL$xo$. The select gate transistor S2 is connected to a source line SRC. The control gate of the memory cell MC arrayed on each row is connected in common to word lines WL0, WL1, WL2 to WL31. The select gate transistor S1 is connected in common to a select line SGD. The select gate transistor S2 is connected in common to a select line SGS.

The sense amplifier circuit 3 has a plurality of sense amplifier units SAU1 to SAUn. The write completion detection circuit 10 has a plurality of detection units DTU1 to DTUn. The sense amplifier units SAU1 to SAUn are connected to 16 bit lines BL0$e$, BL0$o$ to BL7$e$, BL7$o$, BL8$e$, BL8$o$ to BL15$e$, BL15$o$, ..., BL$x$-7$e$, BL7$o$ to BL$xe$ and BL$xo$. The detection circuit units DTU1 to DTUn are the sense amplifier units SAU1 to SAUn, respectively.

In the memory cell array 1, of the memory cells connected to one word line, a plurality of memory cells connected to even bit lines BL0$e$ to BL$xe$ form two pages. A plurality of memory cells connected to odd bit lines BL0$o$ to BL$xo$ form another two pages.

According to this embodiment, one memory cell is storable with 2-bit data; however, for simplification of explanation, it is assumed that one memory cell is stored with 1-bit data. However, this embodiment is applicable to a multi-value memory, which is capable of storing three-bit data or more in one memory cell. In this case, the memory cells connected to the even bit line and connected to the odd bit line each form 3 pages.

The sense amplifier units SAU to SAUn each detect and hold data read to the bit line from the memory cell in a data read operation. In a data write operation, data is collectively written to one-page memory cell connected to the selected word line. Each of the sense amplifier units SAU to SAUn has eight sense amplifiers and one flag unit for detecting a signal showing write completion output from these sense amplifiers.

FIG. 3 shows one example of the sense amplifier units SAU1 to SAUn. These sense amplifier units each have the same configuration, and thus, sense amplifier unit SAU1 will be described below as an example. Sense amplifier unit SAU1 is composed of eight sense amplifiers S/A1 to S/A8 and one flag unit FLU. The foregoing sense amplifiers S/A1 to S/A8 each have the same configuration, and thus, the configuration of sense amplifier S/A1 only is shown in detail.

Sense amplifier S/A1 has a primary data cache (PDC), a secondary data cache (SDC), a dynamic data cache (DDC) and a temporary data cache (TDC). The foregoing SDC, PDC and DDC hold input data in a write operation, hold read data in a read operation, and temporarily hold data in a verify operation, respectively. These SDC, PDC and DDC are used for controlling internal data when multi-value data is stored. The TDC amplifies data of a bit line in a data read operation, and temporarily holds the data, and further, is used for controlling internal data when multi-value data is stored.

The SDC is composed of clocked inverter circuits 61$a$, 61$b$ forming a static latch circuit and an N-channel MOS transistor 61$c$. Transistor 61$c$ is connected between input terminals of the clocked inverter circuits 61a and 61b. The gate of transistor 61c is supplied with a signal EQ2. An N-channel MOS transistor 61d is connected between an output terminal of the clocked inverter circuit 61a and ground. The gate of transistor 61d is supplied with a signal PRST. A node N2a of the SDC is connected to an input/output data line Ion via a column select transistor 61e. A node N2b is connected to an input/output data line Ion via a column select transistor 61f. Each gate of the foregoing transistors 61e and 61f is supplied with a column select signal CSLi. Node N2a of the SDC is connected to a node N1b of the PDC via N-channel MOS transistors 61g and 61h. The gate of transistor 61g is supplied with a signal BLC2 while the gate of transistor 61h is supplied with BLC1.

The PDC is composed of clocked inverter circuits 61i, 61j forming a static latch circuit and an N-channel MOS transistor 61k. Transistor 61k is connected between input terminals of the clocked inverter circuits 61i and 61j. The gate of transistor 61k is supplied with a signal EQ1. A node N1a of the PDC is connected to the gate of an N-channel MOS transistor 61l. One terminal of a current path of transistor 61l is grounded via an N-channel MOS transistor 61m. The gate of transistor 61m is supplied with a signal FCount. The other terminal of the current path o transistor 61l is connected to one terminal of a current path of an N-channel MOS transistor 62a. The gate of transistor 62a is supplied with a signal SEL1 supplied from a detection circuit unit DTU1 describe later. The other terminal of the current path of transistor 62a is connected to a power supply node via a P-channel MOS transistor 62b, and connected to the gate of a P-channel MOS transistor 62c. One terminal of a current path of transistor 62c is connected to a power supply node while the other terminal thereof is grounded via an N-channel MOS transistor 62d. The gate of transistor 62d is supplied with a signal FRST. A connection node of transistors 62c and 63d is connected to a fail bit bus FBB. The fail bit bus FBB is connected in common to all the sense amplifier units SAU1 to SAUn, as described later.

The TDC comprises a MOS capacitor 61p, for example. The capacitor 61p has one terminal connected to a connection node N3 of transistors 61g and 61h, and the other terminal grounded. Connection node N3 is connected with the DDC via an N-channel MOS transistor 61q. The gate of transistor 61q is supplied with a signal REG.

The DDC forming the dynamic latch circuit comprises an N-channel MOS transistor 61r. One terminal of a current path of transistor 61r is supplied with a signal VPRE while the other terminal thereof is connected to the current path of transistor 61q. The gate of transistor 61r is connected to a node N1b of the PDC via an N-channel MOS transistor 61s. The gate of transistor 61s is supplied with a signal DTG.

Connection node N3 is connected with one terminal of a current path of N-channel MOS transistors 61t and 61u. The other terminal of a current path of transistor 61u is supplied with a signal VPRE while the gate thereof is supplied with a signal BLPRE. The gate of transistor 61t is supplied with a signal BLCLAMP. The other terminal of a current path of transistor 61t is connected to each one terminal of the bit lines BL0e and BL0o via N-channel MOS transistors 61w and 61x. One terminal of the bit lines BL0e and BL0o is connected with one terminal of a current path of N-channel MOS transistors 61y and 61z, respectively. The gates of transistors 61y and 61z are supplied with signals BIASe and BIASo, respectively. The other terminal of the current path of transistors 61y and 61z is supplied with a signal BLCRL. Signal BLCRL is a voltage supplied to a non-select bit line in read and program operations.

Node N1a of each PDC of the sense amplifiers S/A1 to S/A8 is connected to each gate of N-channel MOS transistors 64-1 to 64-8 forming the flag unit FLU. One terminal of a current path of these transistors 64-1 to 64-8 is connected to a power supply node via a P-channel MOS transistor 63, and the other terminal thereof is grounded. The gate of transistor 63 is supplied with a signal ALL_SCANn. A signal FLAG1 is output by a connection node of transistors 64-1 to 64-8 and transistor 63. Signal FLAG1 is supplied to detection circuit unit DTU1.

The foregoing signal and voltage of sense amplifier S/A1 are generated by the control signal generation circuit 8 and the control voltage generation circuit 9, which are shown in FIG. 1. Data write, verify and read operations are controlled based on the control of the foregoing control signal generation circuit 8 and control voltage generation circuit 9.

The operation of the sense amplifier having the foregoing configuration will be schematically described. In a data write operation, write data is stored in the DDCs of all sense amplifiers. Thereafter, when a transfer command is input, data of the PDCs of all sense amplifiers are transferred to the PDC. Thereafter, signal BLC1 of the sense amplifier is made high to turn on transistor 61h. In this way, a select bit line, for example, BL0e is set to Vdd when data "1" is stored in node N1b of the PDC (write is not executed). When data "0" is stored in node N1b of the PDC (write is executed), the bit line BL0e is set to Vss. Write is never executed with respect to a non-select page (bit line is non-select) cell connected to the selected word line. For this reason, the bit lines connected to the cells are set to Vdd like the foregoing data "1".

Here, the select line SGD of the selected block is set to Vdd so that the select word line is supplied with a program voltage Vpgm (20V) and the non-select word line is supplied with Vpass (10V). When the bit line is set to Vss, the cell channel is set to VSS while the word line is set to Vpgm; therefore, write is executed. Conversely, when the bit line is set to Vss, the cell channel steps up the voltage Vpgm, and not Vss. For this reason, about voltage Vpgm/2 is applied in coupling. Therefore, the cell is not programmed. In this way, the memory cell is programmed.

Program verify executed after write is the same as the read operation. Signals BLCLAMP and BLPRE are made high, and then, the select bit line is pre-charged to a high level. Thereafter, the select word line is supplied with a verify voltage slightly higher than the potential of the read operation, and thus, data of the memory cell is read. The program verify is executed; as a result, if a threshold voltage of the memory cell reaches a target threshold level (the case where write is "pass"), the potential of the bit line is made high because the memory cell is in an off state. For this reason, node N1b of the PDC is set to data "1", and then, handled as write non-select in the next write operation. Conversely, the program verify is executed; as a result, if the threshold voltage of the memory cell does not reach the target threshold level (the case where write is "fail"), the memory cell is an on state; therefore, the potential of the bit line is made low. For this reason, node Nb1 of the PDC is set to data "0". In this case, the program voltage is slightly stepped up, and then, program is again executed.

FIG. 4 schematically shows the relationship between the sense amplifier units SAU1 to SAUn and the detection circuit units DTU1 to DTUn.

The detection circuit units DTU1 to DTUn are arranged correspondingly to the sense amplifier units SAU1 to SAUn. The sense amplifier units SAU1 to SAUn are supplied with signals ALL_SCANn and FCount from the control signal generation circuit 8. Signals FLAG1 to FLAGn output from the sense amplifier units SAU1 to SAUn are supplied to the corresponding detection circuit units DTU1 to DTUn. Signals SEL1 to SELn output from the detection circuit units DTU1 to DTUn are supplied to the corresponding sense amplifier units SAU1 to SAUn. The detection circuit units DTU1 to DTUn are supplied with a signal PCn, a signal ADDsel, an inverted signal ADDseln, a signal ISO_CLK and a signal ISO_RSTn.

A signal DETECTn is supplied to detection circuit unit DTU1. Signal DETECTn propagates a discharge path (potential transfer path) 70 formed in the detection circuit units DTU1 to DTUn. An output terminal of detection circuit unit DTUn situated at the termination of the discharge path 70 is connected to a power supply node via a P-channel MOS transistor 71 while being grounded via a MOS capacitor 72. A signal SCAN_ENDn output from a connection node of transistor 71 and the capacitor 72 is supplied to the control signal generation circuit 8.

A fail bit bus FBB of eight sense amplifiers forming each of the sense amplifier units SAU1 to SAUn, that is, an 8-bit width fail bit bus FBB is connected to a bit counter 73. An output signal of the bit counter 73 is supplied to a comparator 74. The comparator 74 is supplied with an allowable value FCriteria and an operation clock signal AccumCLK. The comparator 74 compares the output signal of the bit counter 73 with the allowable value FCriteria. The comparator further has an accumulation register 75. The comparison result of the comparator 74 is held in the accumulation register 75. A signal PASS showing the write completion detection result is output from an output terminal of the comparator 74.

Figure 5:
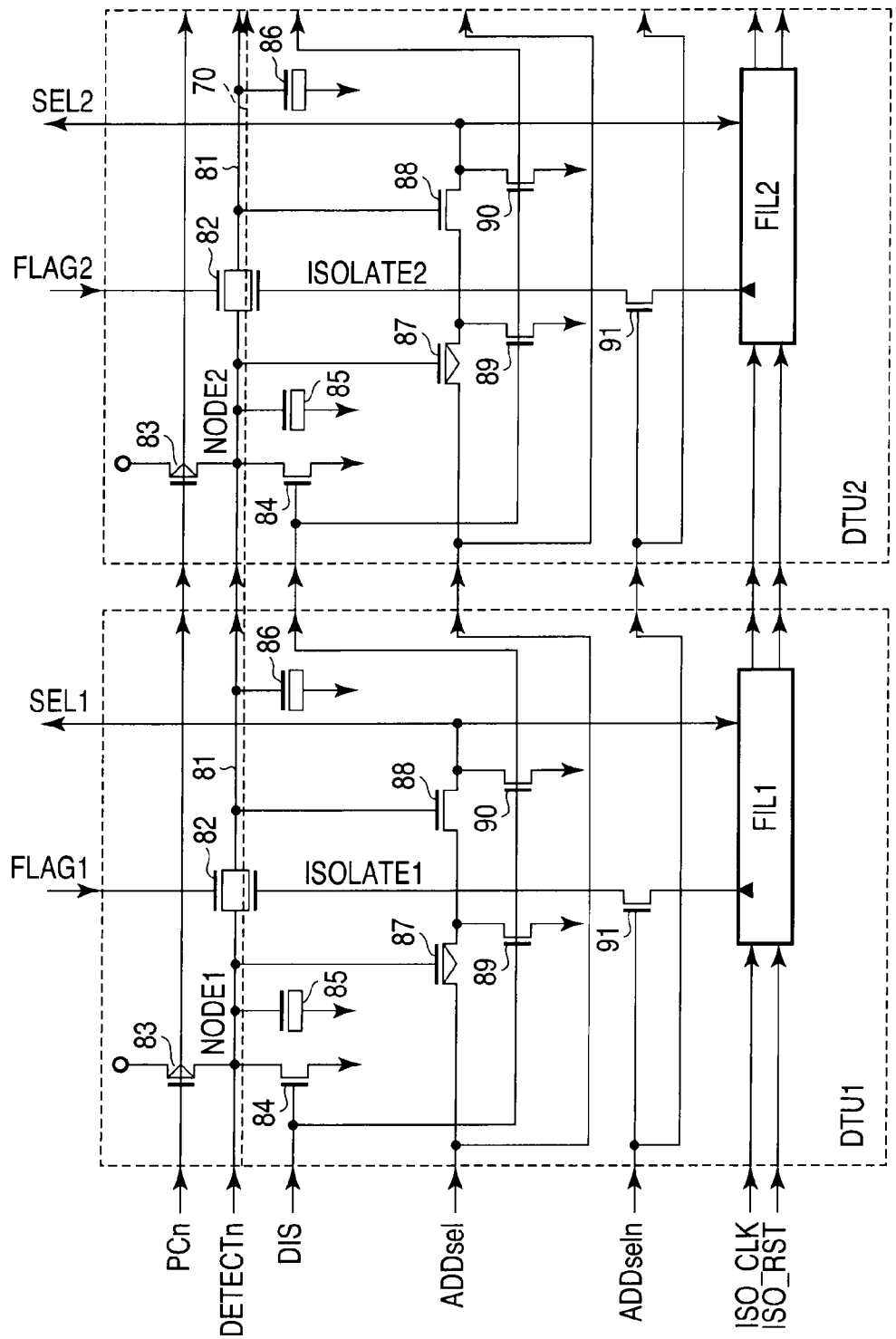
FIG. 5 is a circuit diagram showing the configuration of a detection circuit unit.

FIG. 5 shows one example of the configuration of the detection circuit units DTU1 to DTUn. In FIG. 5, the same reference numerals are used to designate portions identical to FIG. 4. The foregoing detection circuit units DTU1 to DTUn each have the same configuration. Therefore, the configuration of detection circuit unit DTU1 will be described below, and the same numerals as detection circuit unit DTU1 are given to detection circuit unit DTU2.

In detection circuit unit DTU1, a transfer gate 82 is inserted in an interconnect 81 supplied with a signal DETECTn. One gate of the transfer gate 82 is supplied with a signal FLAG1 output from sense amplifier unit SAU1. The other gate of the transfer gate 82 is supplied with a signal ISOLATE1 output from a fail information latch circuit FIL1 via an N-channel MOS transistor 91. The gate of transistor 91 is supplied with a signal ADDseln.

A P-channel MOS transistor 83 is connected between the interconnect 81 connected to the input side of the transfer gate 82 and a power supply node. The gate of transistor 83 is supplied with a signal PCn. An N-channel MOS transistor 84 and a MOS capacitor 85 are connected between the interconnect 81 connected to the input side of the transfer gate 82 and ground. The gate of transistor 84 is supplied with a signal DIS. A MOS capacitor 86 is connected between the interconnect 81 connected to the output side of the transfer gate 82 and ground.

Signal ADDsel is supplied to one terminal of a current path of a P-channel MOS transistor 87. The other terminal of transistor 87 is connected to one terminal of a current path of an N-channel MOS transistor 88. The gate of transistor 87 is connected to the interconnect 81 on the input side of the transfer gate 82. The gate of transistor 88 is connected to the interconnect 81 on the output side of the transfer gate 82. An N-channel MOS transistor 89 is connected between the other terminal of the current path of transistor 87 and ground. An N-channel MOS transistor 90 is connected between the other terminal of the current path of transistor 88 and ground. Each gate of these transistors 89 and 90 is supplied with a signal DIS. A signal SEL1 is output from the other terminal of the current path of transistor 88. Signal SEL1 is supplied to sense amplifier unit SAU1 and the fail information latch circuit FIL1. The fail information latch circuit FIL1 is supplied with signals ISO_CLK and ISO_RST.

In the detection circuit units DTU1 to DTUn, an input node of the transfer gate 82 is called NODE1, NODE2 to NODEn.

FIG. 6 shows the configuration of the fail information latch circuit FIL1. In FIG. 6, a P-channel MOS transistor 102, an input terminal of a latch circuit 101, N-channel MOS transistors 103 and 104 are connected in series between a power supply node and ground. The gate of transistor 102 is supplied with a signal ISO_RSTn. The gate of transistor 103 is supplied with a signal SEL1. The gate of transistor 104 is supplied with a signal ISO_CLK. A signal ISOLATE is output from an output terminal of the latch circuit 101.

FIGS. 7A to 7C schematically show a fail bit detection operation according to this embodiment. According to this embodiment, it is assumed that sense amplifier units SAU2 and SAU3 each include a fail bit. In the foregoing state, a detection operation is successively carried out from sense amplifier unit SAU1 toward SAUn, as shown in FIG. 7A. When detection is made such that sense amplifier unit SAU2 has a fail bit as depicted in FIG. 7A, the bit counter 73 counts the number of fail bits of sense amplifier unit SAU2, and then, the counted number of fail bits is accumulated by the accumulation register 75. Thereafter, the comparator 74 compares the accumulated value of the accumulation register 75 with an allowable value. If the accumulated value is less than the allowable value, a sense amplifier unit having the remaining fail bit is detected. In this case, sense amplifier units completing fail bit accumulation are connected by the discharge path 70, and in this state, a sense amplifier unit having the remaining fail bit is detected.

As a result, when detection is made such that sense amplifier unit SAU3 has a fail bit as seen from FIG. 7B, the bit counter 73 counts the number of fail bits of sense amplifier unit SAU3, and then, the counted number of fail bits is accumulated by the accumulation register 75. Thereafter, the comparator 74 compares the accumulated value of the accumulation register 75 with an allowable value. If the accumulated value is less than the allowable value, a sense amplifier unit having the remaining fail bit is detected. The operation described above is repeated.

The condition of completing the foregoing repeat is as follows:

(1) Case where the accumulated value is less than the allowable value, and as shown in FIG. 7C, the discharge path 70 of all the sense amplifier units SAU1 to SAUn is connected (write completion case); and (2) Case where the accumulated value exceeds the allowable value (write incompletion case).

With the foregoing configuration, a write completion detection operation using the detection circuit units DTU1 to DTUn shown in FIGS. 4 to 6 will be described below with reference to FIGS. 8 and 9.

Figure 8:
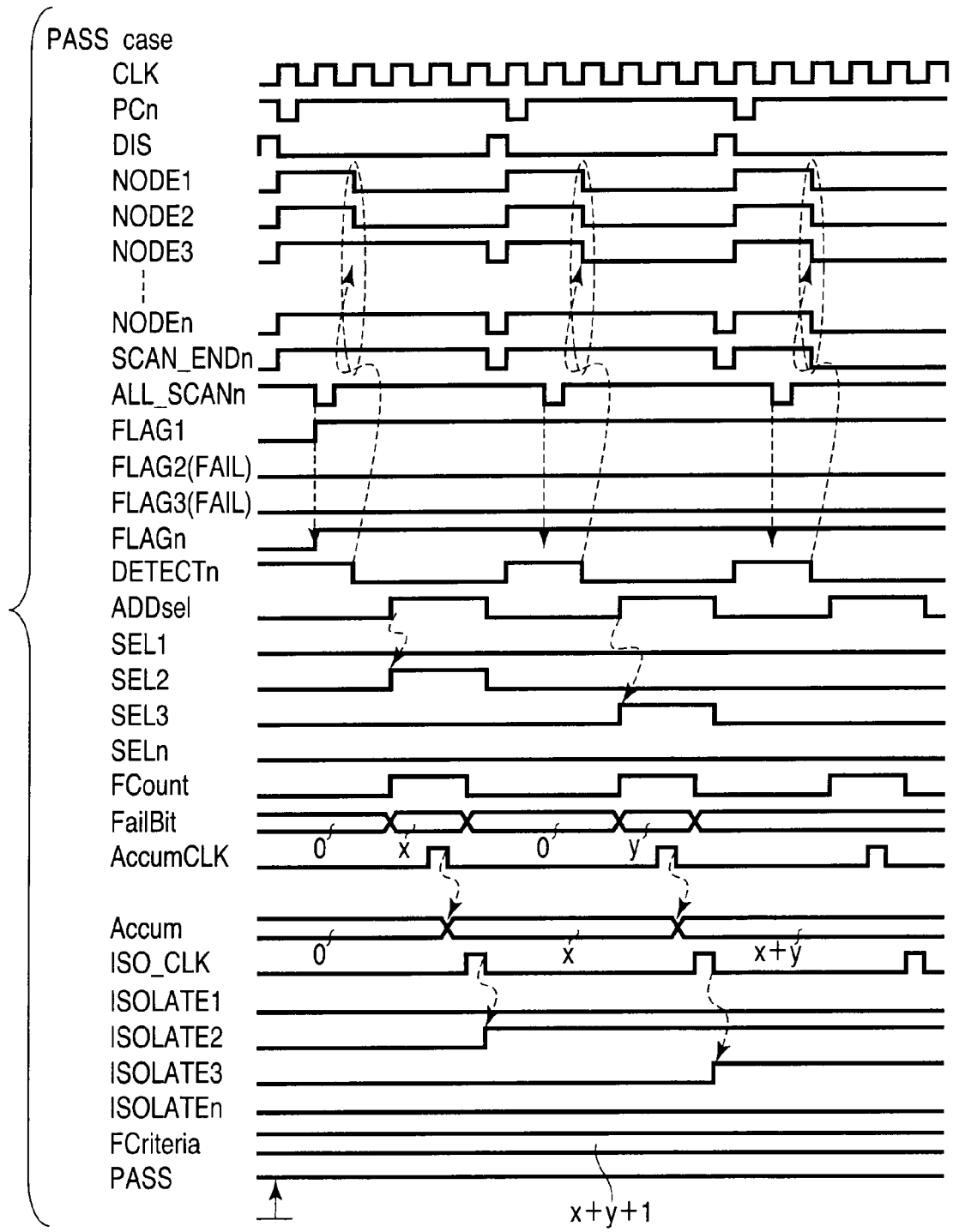
FIG. 8 is a waveform chart showing one example of a fail bit detection operation according to one embodiment.

FIG. 8 shows the repeat completion condition (1), that is, an operation of the case of detecting write completion. FIG. 9 shows the repeat completion condition (2), that is, an operation of the case of detecting write incompletion.

The operation shown in FIG. 8 will be described. Memory cell write and write verify operations end, and thereafter, when an operation of detecting write completion is started, signal DIS is made high for one clock period. Then, transistors 84, 89 and 90 of each of the detection circuit units DTU1 to DTUn are turned on. Further, NODE1 to NODEn and signals SEL1 to SELn are reset to low.

Signal PCn is made low for one clock period. In this way, in a state that transistor 84 is turned off, transistor 83 and transistor 71 shown in FIG. 4 are turned on. Therefore, NODE1 to NODEn and signal SCAN_ENDn are pre-charged to a high level.

For the next one clock period, signal ALL_SCANn is made low, and thereby, signals FLAG1 to FLAGn showing write completion of the sense amplifier units SAU1 to SAUn are defined.

Specifically, in sense amplifier unit SAU1 shown in FIG. 3, when signal ALL_SCANn is made low, transistor 63 is turned on. In this state, nodes N1*b* of the PDCs of all the sense amplifiers S/A1 to S/A8 of sense amplifier unit SAU1 are latched high. In this case, transistors 64-1 to 64-8 forming the flag unit FLU are all turned off. Therefore, the output signal FLAG1 of the flag unit FLU is made high. Namely, if 8-bit write is completed, the flag unit FLU outputs a high-level output signal FLAG1.

Assuming that a write incompletion bit exists, any of transistors 64-1 to 64-8 is turned on. For this reason, signal FLAG1 is made low. In this embodiment, it is assumed that write to sense amplifier units SAU2 and SAU3 is not completed. For this reason, signals FLAG2 and FLAG3 are made low.

Signal FLAG1 is made high, and thereby, the transfer gate 82 of detection circuit unit DTU1 shown in FIG. 5 is turned on. Thus, each transfer gate 82 of detection circuit units DTU2 and DTU3 intactly turn off.

At the next clock, when signal DETECTn is made low, the transfer gate 82 of the unit DTU1 is turned on while the transfer gate 82 of the unit DTU2 is turned off. Therefore, charges of the interconnect 81 from NODE1 to NODE2 is discharged. Specifically, the discharge of the interconnect 81 is stopped when signal FLAG becomes low. Namely, NODE3 to NODEn of the interconnect 81 shown on the right side of FIG. 8 are all kept high.

When signal ADDsel is made high, NODE1 and NODE2 of the interconnect 81 are made low. Thus, in detection circuit unit DTU1 shown in FIG. 5, transistor 87 is turned on while transistor 88 is turned off. Therefore, signal SEL1 is kept low. In detection circuit unit DTU2, the gate of transistor 87 connected to NODE2 is turned on while the gate of transistor 88 connected to the interconnect 81 on NODE3 (not shown) is turned on. Therefore, signal SEL2 is made high. Transistors 87 of detection circuit units DTU3 to DTUn corresponding to NODE3 to NODEn are all turned off. Thus, signals SEL3 to SELn of detection circuit units DTU3 to DTUn are intactly kept low.

As described above, signal ADDsel and transistors 87 and 88 are used, and thereby, signal SELm only of detection circuit unit DTUm having a low NODEm and a high NODEm+1 is made high. In other words, a sense amplifier unit including a fail bit is detected.

According to this embodiment, signal ADDsel is made high, and thereby, sense amplifier unit SAU2 supplied with a high signal SEL2 is given as a bit count target. In other words, sense amplifier unit SAU2 only having the selected signal SEL2 is selected by signal FCount. Namely, a signal showing a fail bit of sense amplifier unit SAU2 is transferred to the fail bit bus FBB, and the, the bit counter 73 counts the number of fail bits.

Specifically, assuming that sense amplifier S/A1 shown in FIG. 3 is determined as sense amplifier unit SAU2, node N1*b* of the PDC corresponding to the fail bit is low. Thus, transistor 61*l* is turned on. In a state that signal SEL1 corresponding to signal SEL2 is high, when signal FCount is made high, transistors 61*m*, 61*l* and 62*a* are turned on while transistor 62*c* is turned on. Therefore, the fail bit bus FBB is made high. The bit counter 73 counts the number of highs of the fail bit bus FBB.

When signal AccumCLK is made high for one clock period, a count value of the bit counter is accumulated in the accumulation register 75 of the comparator 74. The comparator 74 compares the number of accumulated fail bits with an allowable value FCriteria of a fail bit. As a result, if the number of fail bits is less than the allowable value (allowable value≧number of incompletion bit), the output signal PASS of the comparator 74 is kept high.

When signal PASS is kept high, and signal SCAN_ENDn is high, it is regarded that fail bits, which is not accumulated, still exist; thus, a detection operation is continued.

Specifically, when signal ISO_CLK is made high, it is determined that signal SEL2 only is incompletion bit in high signals SEL1 to SELn. Then, the foregoing information is stored in the corresponding fail latch circuit FIL2. In other words, if the fail information latch circuit FIL1 shown in FIG. 6 is assumed as FILS of detection circuit unit DTU2, signal SEL2 corresponding to signal SEL1 is made high. Thus, transistor 103 is turned on. In this state, when signal ISO_CLK is made high, transistor 104 is turned on; as a result, held data of the latch circuit 101 is inverted. For this reason, signal ISOLATE2 corresponding to the output signal ISOLATE1 of the latch circuit 101 is made high. Therefore, the transfer gate 82 of detection circuit DTU2 is turned on according to signal ISOLATE2, and thus, the discharge path 70 connecting NODE2 and NODE3 is formed.

As described above, when the fail information latch circuit FILm of detection circuit DTUm completing fail bit accumulation is stored with incompletion bit information, the discharge path connecting NODEm and NODEm+1 is formed. Therefore, it is possible to detect a sense amplifier unit, which does not still complete fail bit accumulation.

According to this embodiment, it is assumed that sense amplifier unit SAU3 has a fail bit. For this reason, when signal ADDsel is again made high, the same operation as above is carried out with respect to detection circuit unit DTU3. Specifically, signal SEL3 of detection circuit unit DTU3 is made high in accordance with signal ADDsel. Thus, incompletion bits of sense amplifier unit SAU3 is counted by the bit counter 73. The count value of the bit counter 73 is accumulated by the accumulation register 75 of the comparator 74, and thereafter, the comparator 74 compares the accumulation value of the accumulation register 75 with an allowable value. Thereafter, when signal ISO_CLK is made high, the output signal ISOLATE3 of the fail information latch circuit FIL3 of detection circuit unit DTU3 is made high. In this way, the discharge path 70 is formed between detection circuit unit DTU3 and detection circuit unit DTU4.

The foregoing operation is carried out, and thereby, when all discharge path 70 of the detection circuit units DTU1 to DTUn are connected, the connection node of transistor 71 and the MOS capacitor 72 shown in FIG. 4 is made low via the discharge path 70. Therefore, signal SCAN_ENDn is made low, and thus, the detection operation is completed. If the output signal PASS of the comparator 74 is kept high, it can be seen that the number of fail bits is less than a bit detection allowable value. Therefore, it is determined that the write operation is completed because of passing write completion detection.

Figure 9:
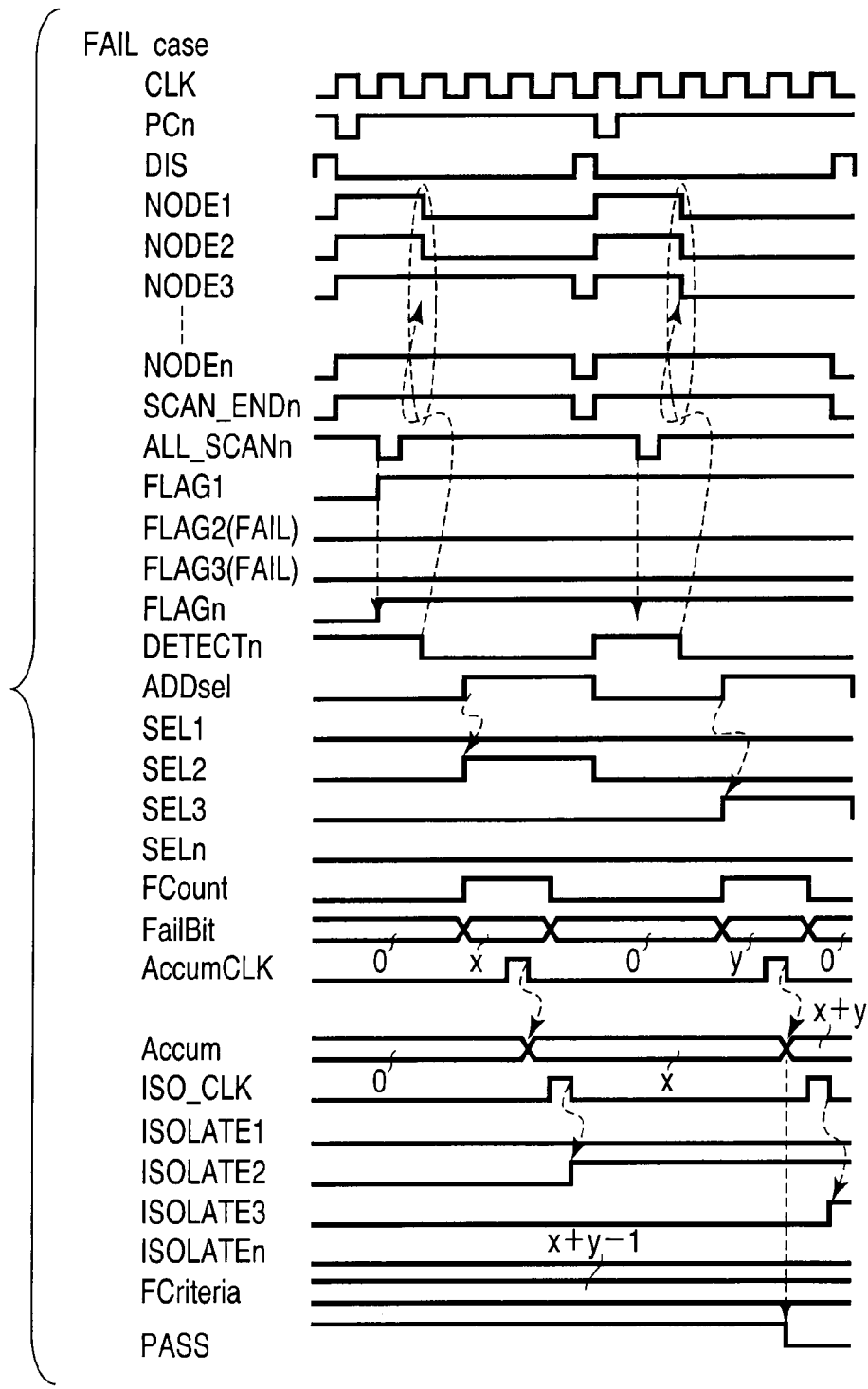
FIG. 9 is a waveform chart showing another example of a fail bit detection operation according to one embodiment.

As shown in FIG. 9, the bit counter counts the number of fail bits, and then, if a count number (x+y) accumulated by the accumulation register 75 is larger than an allowable value FCriteria (x+y−1), the output signal PASS of the comparator 74 is low. In this case, write incompletion detection is not made with respect to all sense amplifier units, and thus, it is determined write fails. In other words, a write operation is regarded as being insufficient, the fail bit detection operation ends, and then, the operation is returned to a write operation.

According to the foregoing embodiment, the detection circuit units DTU1 to DTUn arranged correspondingly to the sense amplifier units SAU1 to SAUn form the discharge path for transferring potential. The following detection is made according to detection output signals of the sense amplifier units SAU1 to SAUn. Namely, write incompletion cell is included in a sense amplifier unit corresponding to a portion where the discharge path 70 breaks off. Therefore, it is possible to detect a sense amplifier unit including a fail bit at high speed.

In addition, the fail bit included in the detected sense amplifier unit is accumulated, and thereafter, the transfer gate of the detection circuit unit corresponding to the accumulation target sense amplifier is turned on to connect the broken-off discharge path. For this reason, a sense amplifier unit having fail bit accumulation completion is excluded from the accumulation target. Therefore, a sense amplifier unit including the remaining fail bit is detected at high speed. In this way, it is possible to count the fail bit at high speed.

FIGS. 10A to 10H show a comparison example of the fail bit detection operation. In this case, as shown in FIG. 10A, batch detection is carried out with respect to all the sense amplifier units SAU1 to SAUn to detect the existence of fail bits. According to the foregoing detection, the existence of fail bits is detected, but the location is not specified. In FIG. 10A, assuming that a fail bit exists in a sense amplifier unit shown by the symbol "×", a sense amplifier unit having a fail bit is detected using a so-called binary search.

Specifically, as illustrated in FIG. 10B, batch detection is carried out with respect to ½ sense amplifier units of all to detect the existence of fail bits. As a result, if the fail bit exists, as seen from FIG. 10C, batch detection is further carried out with respect to ½ (¼ of all) sense amplifier units of all to detect the existence of fail bits. As a result, if the fail bit exists, as depicted in FIG. 10D, batch detection is further carried out with respect to ½ (⅛ of all) sense amplifier units of all to detect the existence of fail bits. As a result, a sense amplifier unit including a fail bit is specified, and then, the number of fails bits included in the sense amplifier unit is counted. Thereafter, as shown in FIGS. 10E to 10H, the same operation as above is carried out with respect to the remaining ½ sense amplifier units, and then, the number of fail bits is counted. According to the comparison example, long time is taken to detect a sense amplifier unit including a fail bit. On the contrary, according to the detection operation, it is possible to easily detect a sense amplifier unit including a fail bit compared with the comparison example, and to count the number of fail bits at high speed.

FIG. 11 shows a modification example of the detection circuit units DTU1 to DTUn, and shows each configuration of DTU1 and DTU2 representing these units. In FIG. 11, signals PCn and DIS shown in FIG. 5 are omitted, and the same number is used to designate portions identical to FIG. 5.

Units DTU1 to DTUn shown in FIG. 5 form the discharge path 70 using the transfer gate 82, and detects write incompletion cell in the following manner. Namely, units DTU1 to DTUn detect a sense amplifier unit corresponding to a portion where the discharge path 70 breaks off, that is, to a portion where one and the other terminals of the transfer gate 82 have different level. On the contrary, DTU1 and DTU2 shown in FIG. 11 each comprise a logic circuit using no transfer gate.

Units DTU1 to DTUn have the same configuration; therefore, the configuration will be described below using detection circuit unit DTU1. Detection circuit unit DTU1 is composed of interconnects 70a and 70b forming a path 70, an OR gate 111, a NOR gate 112, an AND gate 113 and a fail information latch circuit FIL1. The interconnect 70a is connected to one input terminal of the OR gate 111. The interconnect 70a is supplied with a signal DETECTn. One input terminal of the NOR gate 112 is supplied with a signal FLAG1 from the corresponding sense amplifier unit SAU1. The other input terminal of the NOR gate 112 is supplied with a signal ISOLATE1 output from the fail information latch circuit FIL1. An output signal of the NOR gate 112 is supplied to the other input terminal of the OR gate 111. An output terminal of the OR gate 111 is connected to the interconnect 70b. The interconnect 70b is connected to a node NODE2 of neighboring detection circuit unit DTU2. An output signal of the OR gate 111 is supplied to each input terminal of the AND gate 113 together with a signal ADDsel and an inverted signal DETECTn. An output signal SEL of the AND gate 113 is supplied to the fail information latch circuit FIL1 and the corresponding sense amplifier unit SAU1.

According to this modification example, signal PCn shown in FIG. 4 is not employed; therefore, transistor 71 can be omitted. Signal SCAN_ENDn is a signal of NODEn. The fail information latch circuit FIL1 has the same configuration as FIG. 6.

The write completion detection operation using the detection circuit units DTU1 to DTUn will be described below with reference to FIGS. 4, 11, 12 and 13.

Figure 12:
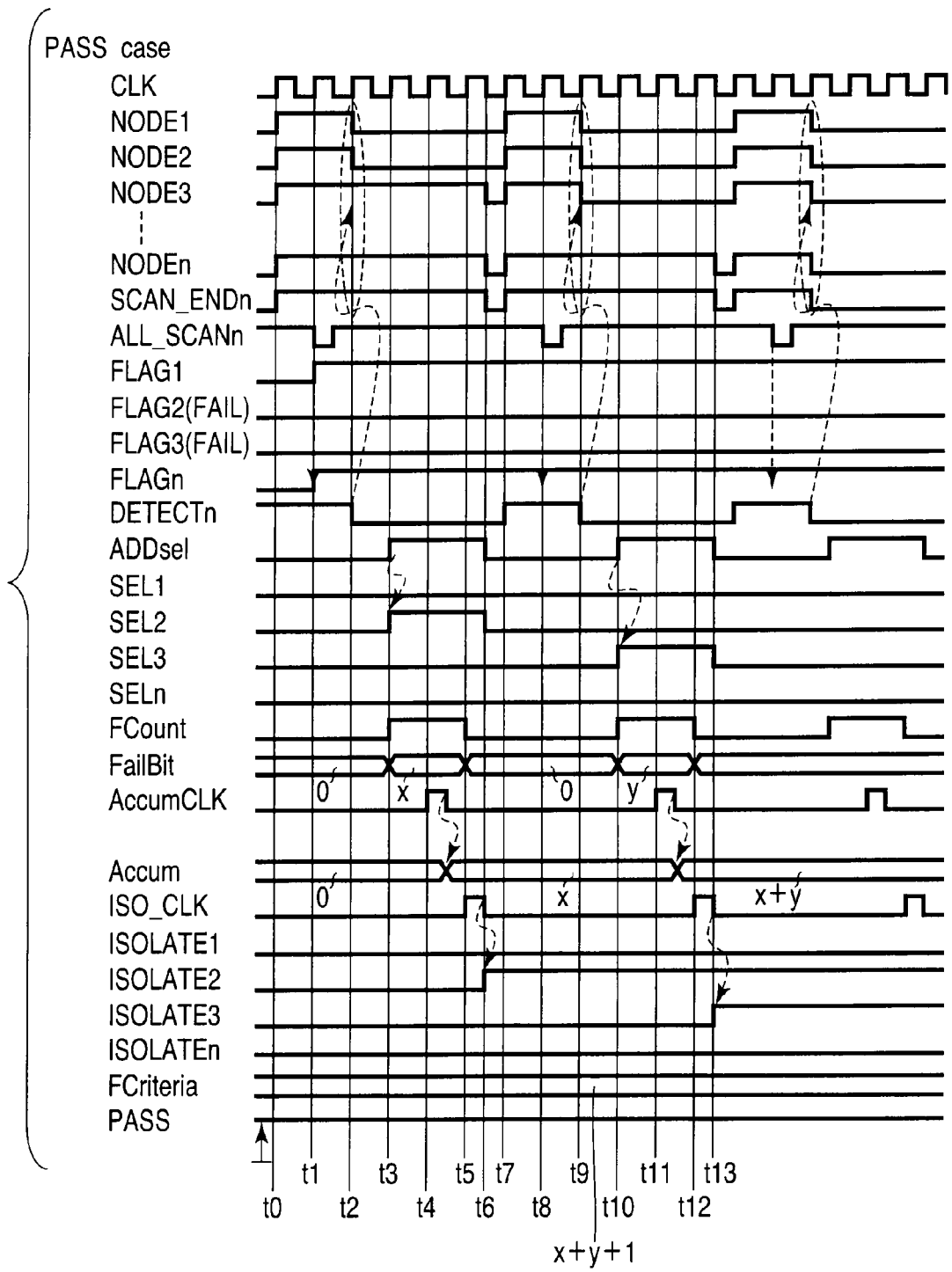
FIGS. 12 and 13 are waveform charts showing the detection circuit unit shown in FIG. 11.
Figure 13:
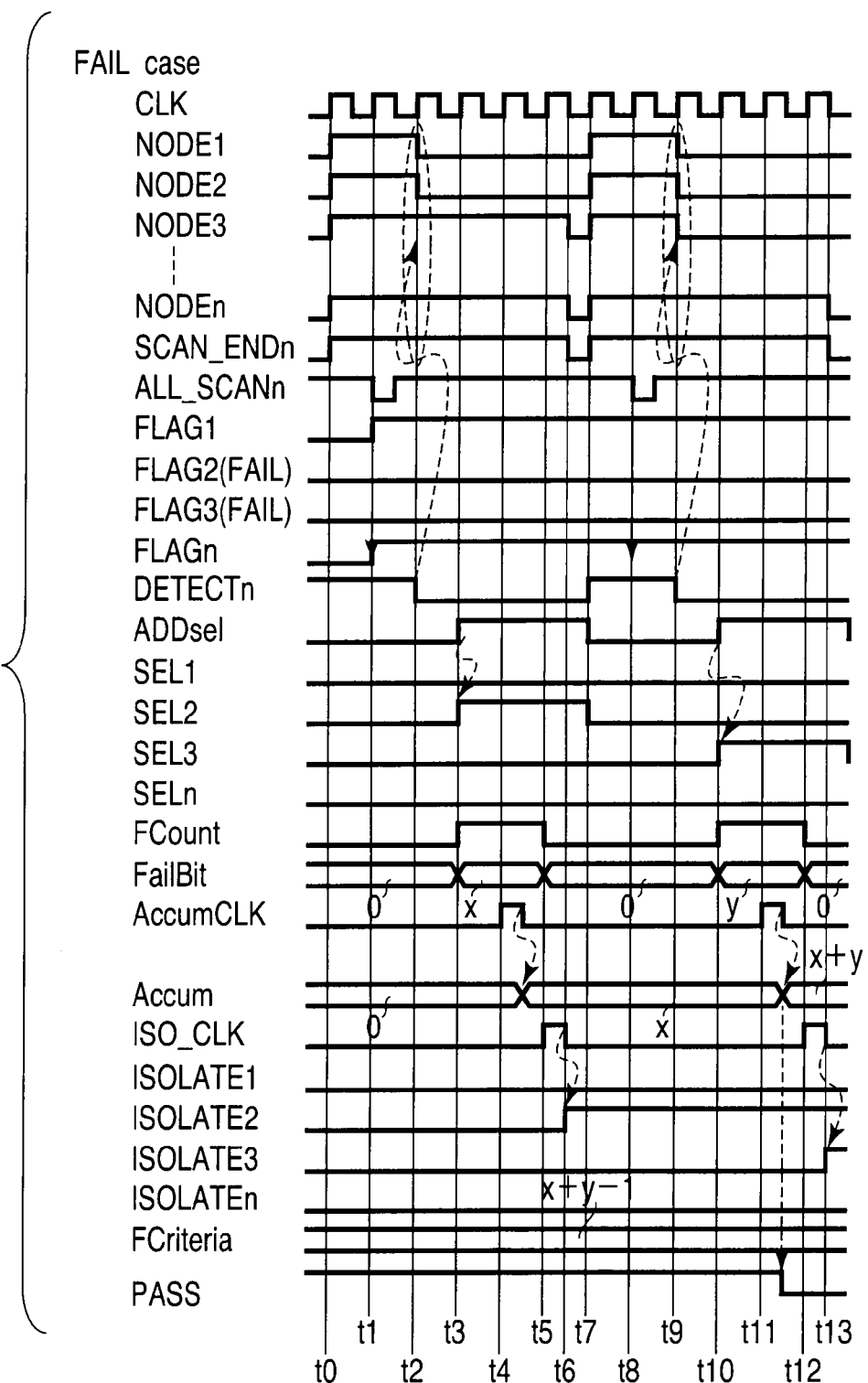

FIG. 12 shows a repeat completion condition (1), that is, the case of write completion detection. FIG. 13 shows a repeat completion condition (2), that is, the case of write incompletion detection. Likewise, in this modification example, it is assumed that sense amplifier units SAU2 and SAU3 include fail bits as shown in FIG. 7A.

As depicted in FIG. 12, at time t0, signal DETECTn is made high, signals FLAG1 to FLAGn showing write completion of the sense amplifier units SAU1 to SAUn are each made low, and signals ISOLATE1 to ISOLATEn are each made low. Signal DETECTn is high; therefore, an output signal of each OR gate 111 is high, and nodes NODE1 to NODEn of the detection circuit units DTU1 to DTUn are made high. Moreover, signal ADDsel is low; therefore, output signals SEL1 to SELn of AND gates 113 are made low.

At time t1, signal ALL_SCANn is made low, and thereby, signals FLAG1 to FLAGn showing write completion of the sense amplifier units SAU1 to SAUn are defined. Thus, signals FLAG2 and FLAG3 output from sense amplifier units SAU2 and SAU3 including a fail bit are made low. Conversely, signals FLAG1, FLAG4 (not shown) to FLAGn of sense amplifier units SAU1, SAU4 (not shown) to SAUn other than sense amplifier units SAU2 and SAU3 are made high.

In FIG. 11, signal FLAG1 is high while signal FLAG2 is low; therefore, an output signal of the NOR gate 112 of detection circuit unit DTU1 is made low. Conversely, an output signal of the NOR gate 112 of detection circuit unit DTU2 is made high.

At time t2, when signal DETECTn is made low, an output signal of the OR gate 111 of detection circuit unit DTU1 is made low. Thus, nodes NODE1 and NODE2 are both made low.

At time t3, when signal ADDsel is made high, the output signal SEL1 of the AND gate 113 of detection circuit unit DTU1 is intactly kept low because the input condition is not satisfied. Conversely, the output signal SEL2 of the AND gate 113 of detection circuit unit DTU2 is made high because the input condition is satisfied. Thus, sense amplifier unit SAU2 supplied with signal SEL2 is employed as a bit count target. In other words, sense amplifier unit SAU2 only having the selected signal SEL2 is selected according to a signal FCount, and then, the bit counter 73 counts the number of fail bits.

At time t4, when signal AccmCLK is made high for one clock period, the count value of the bit counter 73 is accumulated in the accumulation register 75 of the comparator 74. The number of accumulated fail bits is compared with a fail bit allowable value FCriteria by the comparator 74. As a result, if the number of fail bits is less than the allowable value (allowable value≧number of incompletion bits), the output signal PASS of the comparator 74 is kept high.

If signal PASS is kept high and signal SCAN_ENDn is high, it is determined that fail bits, which are not accumulated, still exist; therefore, the detection operation is continued.

Specifically, at time t5, when signal ISO_CLK is made high, the high-level signal SEL2 only of signals SEL1 to SELn is determined as having incompletion bit. Then, the information is stored in the corresponding fail information latch circuit FIL2. As a result, at time t6, signal ISOLATE2 only is made high, and other signals ISOLATE1, 3 to n are intactly low. Therefore, the output signal of the NOR gate 112 of detection unit DTU2 is made low while the output signal SEL2 of the AND gate 113 is made low.

Thereafter, as seen from t7 to t13, the operation from time t0 to t6 is carried out. At time t10, when signal ADDsel is made high, the output signal of the OR gate 111 of detection unit DTU2 is low. For this reason, the input condition of the AND gate 113 is not satisfied. Thus, the output signal SEL2 of the AND gate 113 is kept low. In this case, NODE3 as an input terminal of the OR gate 111 of detection circuit unit DTU3 supplied with a low signal FLAG3 is low while NODE4 as an output terminal is high. Therefore, the input condition of the AND gate 113 is satisfied, so that the output signal SEL3 of the AND gate 113 is made high. As a result, sense amplifier unit SAU3 is employed as a bit count target, and then, the fail bit of sense amplifier unit SAU3 is counted in the manner described above.

As described above, when signal ADDsel is made high, only the output signal SEL of the AND gate 113 included in a specific detection circuit unit is made high. The specific detection circuit unit includes the OR gate 111 of which the input signal is low and of which the output signal is high. For this reason, the path 70 breaks off; therefore, a bit count target sense amplifier unit is detected. When the bit count is carried out, signal ISOLATE output from the fail information latch circuit FIL is made high, so that it is excluded from the bit count target.

The foregoing operation is carried out; as a result, when the path 70 of the detection circuit units DTU1 to DTUn is connected, signal SCAN_ENDn is made low via the path 70, and thus, the detection operation is completed. In this case, if the output signal PASS of the comparator 74 stays high, it can be seen that the number of fail bits is less than the allowable value. Therefore, it is regarded that write completion detection is passed, and thus, the write operation is determined as being completed.

As shown in FIG. 13, the bit counter 73 counts the number of fail bits. As a result, if a count number (x+y) accumulated in the accumulation register 75 is larger than an allowable value FCriteria (x+y−1) (allowable value<number of incompletion bits), an output signal PASS of the comparator 74 is low (times t11 to t12). In this case, it is determined that write fails without carrying out write incompletion detection with respect to all sense amplifier units. In other words, a write operation is determined as being insufficient, and then, the fail bit detection operation ends, and thereafter, the operation is returned to the write operation.

According to the modification example shown in FIG. 11, the same effect as the foregoing embodiment is obtained. In addition, according to this modification example, a long discharge path is not provided; a high-speed operation is possible compared with the embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array having a plurality of memory cells arranged in row and column directions;
a plurality of sense amplifier units configured to detect write completion of the selected memory cells; and
a plurality of detection units arranged correspondingly to the sense amplifier units, each of the detection units forming a transfer path for transferring potential in accordance with detection signals output from the sense amplifier units, and detecting a sense amplifier unit corresponding to a portion where the transfer path breaks off as a sense amplifier unit including a write incompletion bit,
wherein each of the detection units includes:
a first conductivity type transfer gate having first and second gates, and having a current path inserted in the transfer path, a detection signal output from the sense amplifier unit being supplied to the first gate;
a second conductivity type first transistor having a gate connected to one terminal of the current path of the transfer gate, one terminal of a current path of the first transistor receiving a control signal;
a first conductivity type second transistor having a gate connected to the other terminal of the current path of the transfer gate, the second transistor having one terminal of a current path connected to the other terminal of the current path of the first transistor, a select signal being output from the other terminal of the current path; and
a first circuit having an input terminal connected to the other terminal of the current path of the second transistor and having an output terminal connected to the second gate of the transfer gate, the first circuit conducting the transfer gate when the select signal is output from the other terminal of the current path of the second transistor.

2. The device according to claim 1, further comprising:
a counter configured to count the number of write incompletion bits included in the sense amplifier unit detected by the detection unit;
a register configured to accumulate a count value of the counter; and
a comparator configured to compare the count value accumulated in the register with a reference value.

3. The device according to claim 2, wherein each of the sense amplifier units includes:
a second latch circuit configured to hold a signal read from the memory cell;
a first conductivity type fourth transistor having one terminal of a current path connected to an output voltage of the second latch circuit, and having a gate supplied with the select signal output from the other terminal of a current path of the second transistor; and a second circuit connected to the other terminal of the fourth transistor to supply a signal to the counter.

4. The device according to claim 3, wherein each of the sense amplifier units further includes:

a plurality of fifth transistors each having one terminal of a current path connected to the corresponding detection unit of the detection units, each gate of the fifth transistors being connected to an output terminal of the second latch circuit provided in one of the sense amplifier units.

5. The device according to claim 1, wherein the first circuit includes:

a first conductivity type third transistor having a gate supplied with the select signal output from the other terminal of the current path of the second transistor; and a first latch circuit having an input terminal connected to one terminal of a current path of the third transistor, an output terminal of the first latch circuit being connected to the second gate of the transfer gate.

6. The device according to claim 1, wherein each of the detection unit includes:

a first logic circuit having first and second input terminals and a first output terminal, the first input terminal of the first logic circuit receiving the detection signal output from the sense amplifier unit;

a second logic circuit having third and fourth input terminals and a second output terminal, the third input terminal of the second logic circuit being connected to the first output terminal of the first logic circuit, the fourth input terminal and the second output terminal forming the path;

a third logic circuit having fifth, sixth and seventh input terminals and a third output terminal, the fifth input terminal receiving an inverted signal supplied to the fourth input terminal of the second logic circuit, the sixth input terminal receiving a signal of the second output terminal of the second logic circuit, the seventh input terminal receiving a control signal, the third output terminal outputting a select signal for selecting the sense amplifier unit; and a first circuit having an input terminal connected to the third output terminal of the third logic circuit and having an output terminal connected to the second input terminal of the first logic circuit, the first circuit inverting an output signal of the first logic circuit when receiving a control signal from the third logic circuit.

7. A semiconductor memory device comprising:

a memory cell array having a plurality of memory cells arrayed in row and column directions;

a plurality of sense amplifier units including a plurality of sense amplifiers, each of the sense amplifier units outputting a detection signal showing write completion of each of the memory cells selected in accordance with an output signal of the sense amplifiers; and a plurality of detection units arranged correspondingly to the sense amplifier units, each of the detection units including:

a transfer gate having first and second gates, the first gate being supplied with the detection signal output from the sense amplifier unit;

a first transfer path connected to one terminal of a current path of the transfer gate;

a second transfer path connected to the other terminal of a current path of the transfer gate; and a detection circuit connected to the first ad second transfer paths, the detection circuit detecting the corresponding sense amplifier unit as a sense amplifier unit including a write incompletion bit when potential is different between the first and second transfer paths.

8. The device according to claim 7, further comprising:

a counter configured to count the number of write incompletion bits included in the sense amplifier unit detected by the detection unit;

a register configured to accumulate a count value of the counter; and a comparator configured to compare the count value accumulated in the register with a reference value.

9. The device according to claim 7, wherein the detection circuit includes:

a second conductivity type first transistor having a gate connected to the first transfer path, one terminal of a current path of the first transistor receiving a control signal; and a first conductivity type second transistor having a gate connected to the second transfer path, the second transistor having one terminal of a current path connected to the other terminal of the current path of the first transistor, and having the other terminal outputting a select signal.

10. The device according to claim 9, further comprising:

a first circuit having an input terminal connected to the other terminal of the current path of the second transistor and having an output terminal connected to the second gate of the transfer gate, the first circuit conducting the transfer gate when the select signal is output from the other terminal of the current path of the second transistor.

11. The device according to claim 10, wherein the first circuit includes:

a first conductivity type third transistor having a gate supplied with the select signal output from the other terminal of the current path of the second transistor; and a first latch circuit having an input terminal connected to one terminal of a current path of the third transistor, an output terminal of the first latch circuit being connected to the second gate of the transfer gate.

12. The device according to claim 9, wherein each of the sense amplifier units includes:

a second latch circuit configured to hold a signal read from the memory cell;

a first conductivity type fourth transistor having one terminal of a current path connected to an output voltage of the second latch circuit, and having a gate supplied with the select signal output from the other terminal of a current path of the second transistor; and a second circuit connected to the other terminal of the fourth transistor to supply a signal to the counter.

13. The device according to claim 12, wherein each of the sense amplifier units further includes:

a plurality of fifth transistors each having one terminal of a current path connected to the corresponding detection unit of the detection units, each gate of the fifth transistors being connected to an output terminal of the second latch circuit provided in one of the sense amplifier units.

14. A method of inspecting a semiconductor memory device, comprising:

detecting a sense amplifier unit corresponding to a portion where a path connecting a plurality of detection units arranged correspondingly to a plurality of sense amplifier units and detecting an output signal of each sense amplifier unit, breaks off, as a sense amplifier unit including write incompletion bit;

counting the number of write incompletion bits included in the detected sense amplifier unit;

accumulating the number of the counted bits;

comparing the number of accumulated bits with a reference value; and repeating the detection, the count, the accumulation and the comparison when the number of accumulated bits is less than a reference value.

15. The method according to claim 14, wherein the detection operation ends when all of the detection units are connected by the path.

16. The method according to claim 14, wherein the detection operation ends when the number of accumulated bits exceeds a reference value.

* * * * *